(12) United States Patent
Son

(10) Patent No.: US 12,506,038 B2
(45) Date of Patent: Dec. 23, 2025

(54) WAFER BONDING OVERLAY MEASUREMENT SYSTEM

(71) Applicant: Tokyo Electron Limited, Tokyo (JP)

(72) Inventor: Ilseok Son, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 176 days.

(21) Appl. No.: 18/410,770

(22) Filed: Jan. 11, 2024

(65) Prior Publication Data
US 2025/0233022 A1 Jul. 17, 2025

(51) Int. Cl.
*H01L 21/67* (2006.01)
*G01B 11/26* (2006.01)
*G01B 11/27* (2006.01)
*H01L 21/66* (2006.01)

(52) U.S. Cl.
CPC ............ *H01L 22/12* (2013.01); *G01B 11/272* (2013.01)

(58) Field of Classification Search
CPC .............................. G01B 11/272; H01L 22/12
See application file for complete search history.

(56) References Cited

U.S. PATENT DOCUMENTS

| | | | |
|---|---|---|---|
| 11,309,202 B2* | 4/2022 | Krishnan | G01B 11/06 |
| 2015/0233841 A1 | 8/2015 | Bobrov | |
| 2017/0140955 A1 | 5/2017 | Liu et al. | |
| 2020/0098599 A1 | 3/2020 | Kim et al. | |
| 2021/0072021 A1* | 3/2021 | Hill | G06T 7/0004 |

FOREIGN PATENT DOCUMENTS

| | | |
|---|---|---|
| CN | 115507755 A | 12/2022 |
| CN | 115839669 A | 3/2023 |

OTHER PUBLICATIONS

G. Nádudvari et al., "Infrared Optical Solutions for Void Inspection of Bonded Wafers," 2024 IEEE 10th Electronics System-Integration Technology Conference (ESTC), Berlin, Germany, 2024, pp. 1-4, doi: 10.1109/ESTC60143.2024.10712076. (Year: 2024).*
International Search Report and Written Opinion on PCT Matter PCT/US2024/047608 dated Dec. 23, 2024 (9 pages).

* cited by examiner

*Primary Examiner* — Mark R Gaworecki
(74) *Attorney, Agent, or Firm* — Foley & Lardner LLP

(57) ABSTRACT

A method for overlay measurement is disclosed. The method includes receiving an image of a bonded wafer. The method includes generating, based on the image, a profile of the bonded wafer. The method includes adjusting, using the profile, an objective lens of a single-focus image-based infrared (IR) system to perform an overlay measurement of the bonded wafer.

20 Claims, 6 Drawing Sheets

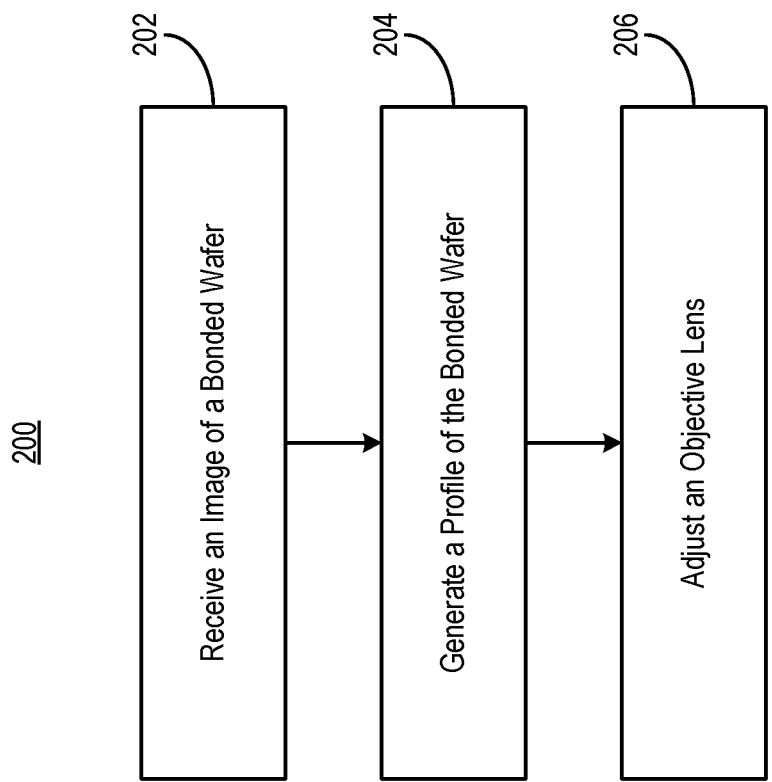

WAFER BONDING OVERLAY MEASUREMENT SYSTEM

FIELD OF THE DISCLOSURE

This disclosure relates to the processing of microelectronic devices including semiconductor devices, transistors, and integrated circuits, including methods for overlay measurement of bonded wafers.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, and greater bandwidth, as well as lower power consumption and latency has grown recently, there has grown a need for improved warpage characterization and control.

SUMMARY

Wafer-to-wafer and chip-to-chip bonding is being implemented to continue Power-Performance-Area-Cost (PPAC) scaling for complex circuits such as are implemented in Systems on Chip (SOCs). Wafer bonding can be performed using at least one suitable bonding technique, such as but not limited to direct wafer bonding, anodic bonding, fusion bonding, adhesive bonding, eutectic bonding, metal diffusion bonding, or glass frit bonding. Upon bonding the wafers, bonding measurement can be performed to check for alignments (or misalignments) or measure the overlay between the wafers. The overlay measurement is performed at the bonding interface of the bonded wafer. A single-focus image-based infrared (IR) bonding overlay measurement system (e.g., sometimes referred to as an optic system or an IR system) is used to perform the overlay measurement. However, because the IR system is single focus (e.g., designed or configured with a fixed focus distance or focal point), measurements of the overlay or warpage may potentially fail if the warpage is greater than or exceed a certain field of depth of the IR system, such as greater than predefined microns based on the capability of the IR system. Further, utilization of an auto-focus functionality can reduce/lower the throughput for measuring the overlay because vertical scans are performed before capturing individual images of the bonded wafer.

The systems and methods of the technical solution provide various embodiments for positioning of objective (or optic) lens of a single-focus IR system for measuring the overlay of the bonded wafer. The systems and methods can adjust the positioning of the objective lens without the auto-focus functionality (e.g., without vertically scanning the entire bonded wafer). For example, the systems and methods can scan the low spatial frequency warpage of the bonded wafer (or other types of imaging). The systems and methods can map the scan of the low spatial frequency warpage to generate a profile (e.g., contour profile) of the warpage presented in the bonded wafer. The systems and methods can adjust the objective lens to follow the contour according to the profile to allow the objective lens to be at or around a predefined distance from the bonded wafer (or the bonding interface of the bonded wafer). After adjusting the objective lens, the systems and methods can capture at least one image of the bonding interface for overlay measurement. Accordingly, the systems and methods can utilize the profile of the bonded wafer for adjusting the objective lens to perform overlay measurement for one or more bonded wafers. In this way, the present disclosure avoids using the auto-focus functionality or vertical scans, thereby improving throughput for overlay measurements.

One embodiment may include a method for measuring overlay. The method includes receiving an image of a bonded wafer. The method includes generating, based on the image, a profile of the bonded wafer. The method includes adjusting, using the profile, an objective lens of a single-focus image-based infrared (IR) system to perform an overlay measurement of the bonded wafer.

In some implementations, the profile comprises a contour of the bonded wafer. Adjusting the objective lens comprises adjusting the objective lens along the contour of the bonded wafer to perform the overlay measurement of the bonded wafer. In some implementations, the contour of the bonded wafer is determined without a vertical scan of the bonded wafer.

In some implementations, generating the profile comprises: scanning a low spatial frequency component of warpage of at least the bonded wafer; and mapping the low spatial frequency component of the warpage to the image of the bonded wafer to generate the profile. In some implementations, adjusting the objective lens comprises adjusting the objective lens to a position having a predefined focal distance from the bonded wafer according to the profile; and responsive to adjusting the objective lens, obtaining at least one image of the bonded wafer at the position using the objective lens.

In some implementations, the bonded wafer comprises a first wafer coupled to a second wafer. The overlay measurement comprises an overlay mark between the first wafer and the second wafer. In some implementations, the method includes receiving a second image of a second bonded wafer. The method includes adjusting, using the profile, the objective lens to perform the overlay measurement of the second bonded wafer. In some implementations, a variation between a first contour of the bonded wafer and a second contour of the second bonded wafer is within a predefined range.

In some implementations, the method includes storing the profile of the bonded wafer in a look-up table in response to generating the profile. In some implementations, receiving the image of the bonded wafer comprises scanning at least one of an x-axis or a y-axis of the bonded wafer to generate the image.

Another embodiment may include a measurement system comprising at least one processor. The at least one processor is configured to receive an image of a bonded wafer. The at least one processor is configured to generate, based on the image, a profile of the bonded wafer. The at least one processor is configured to adjust, using the profile, an objective lens of a single-focus image-based infrared (IR) system to perform an overlay measurement of the bonded wafer.

In some implementations, the profile comprises a contour of the bonded wafer. To adjust the objective lens, the at least one processor is configured to: adjust the objective lens along the contour of the bonded wafer to perform the overlay measurement of the bonded wafer. In some implementations, the contour of the bonded wafer is determined without a vertical scan of the bonded wafer.

In some implementations, to generate the profile, the at least one processor is configured to scan a low spatial frequency component of warpage of at least the bonded wafer. The at least one processor is configured to map the low spatial frequency component of the warpage to the image of the bonded wafer to generate the profile. In some implementations, to adjust the objective lens, the at least one processor is configured to: adjust the objective lens to a position having a predefined focal distance from the bonded wafer according to the profile. Responsive to adjusting the objective lens, the at least one processor is configured to obtain at least one image of the bonded wafer at the position using the objective lens.

Yet another embodiment may include an apparatus. The apparatus includes an inspection system comprising at least one processor configured to: receive an image of a bonded wafer; generate, based on the image, a profile of the bonded wafer. The apparatus includes a single-focus image-based infrared (IR) system comprising an objective lens, configured to adjust, using the profile, the objective lens to perform an overlay measurement of the bonded wafer.

In some implementations, the bonded wafer comprises a first wafer coupled to a second wafer, and wherein the overlay measurement comprises an overlay mark between the first wafer and the second wafer. In some implementations, the at least one processor is further configured to: receive a second image of a second bonded wafer. The single-focus IR system is further configured to adjust, using the profile, the objective lens to perform the overlay measurement of the second bonded wafer.

In some implementations, a variation between a first contour of the bonded wafer and a second contour of the second bonded wafer is within a predefined range. In some implementations, a storage device configured to store the profile of the bonded wafer in a look-up table in response to generating the profile.

These and other aspects and implementations are discussed in detail below. The foregoing information and the following detailed description include illustrative examples of various aspects and implementations and provide an overview or framework for understanding the nature and character of the claimed aspects and implementations. The drawings provide illustrations and a further understanding of the various aspects and implementations and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIG. 2 illustrates a flow chart of an example method for overlay measurement, in accordance with some embodiments.

DETAILED DESCRIPTION

Figure 1:
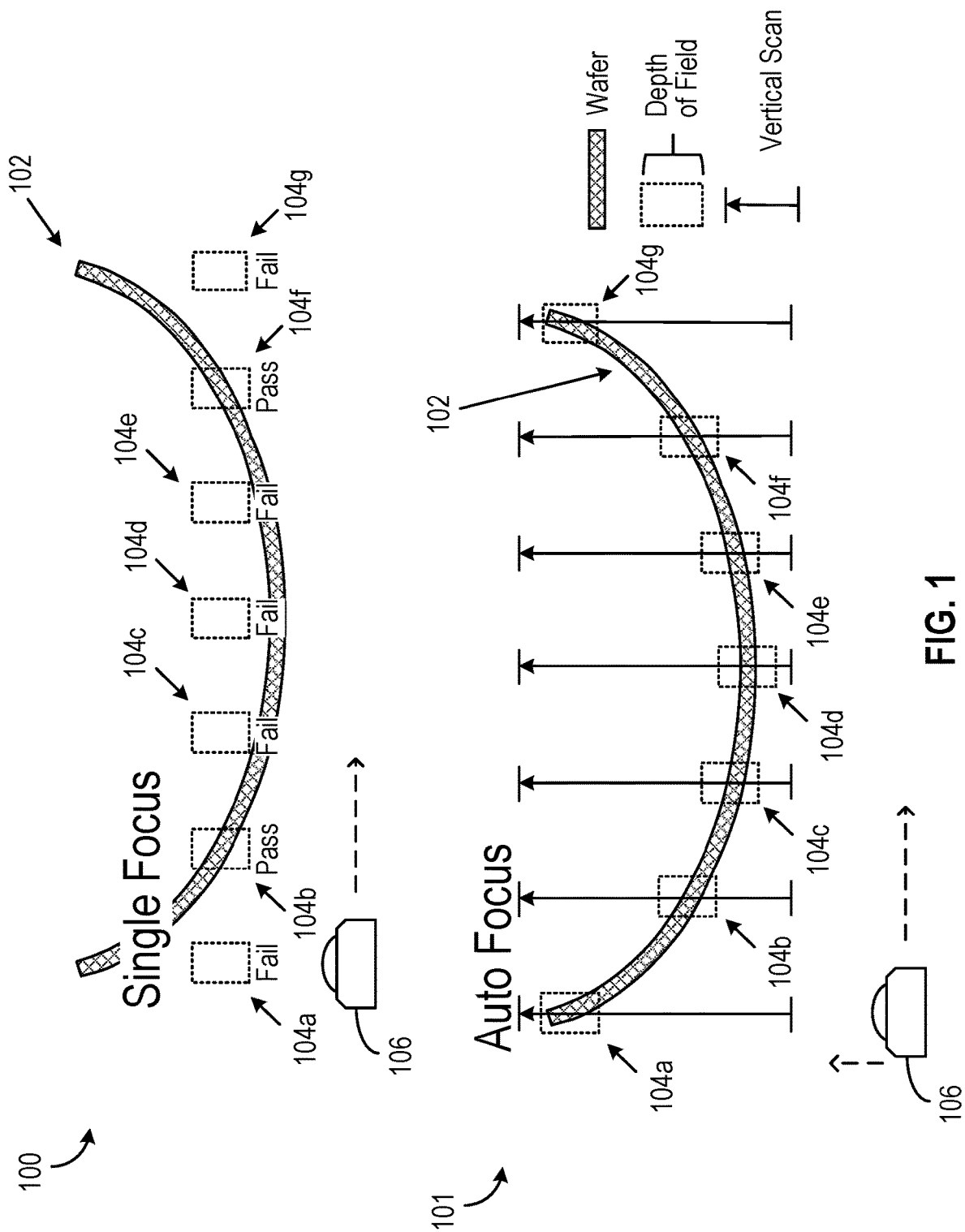
FIG. 1 illustrates an IR system of a certain system with a single-focus functionality and an auto-focus functionality capturing images of a bonding interface, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

In certain systems, wafer-to-wafer and chip-to-chip bonding is being implemented to continue PPAC scaling for complex circuits. Wafer bonding can be performed using at least one suitable bonding technique, such as but not limited to direct wafer bonding, anodic bonding, fusion bonding, adhesive bonding, eutectic bonding, metal diffusion bonding, or glass frit bonding. In certain scenarios, when wafers are bonded, misalignment, overlay, or contour may be observed at the bonding interface between wafers. The bonding interface refers to a region where two or more wafers are joined or bonded together. The wafers that are bonded form a bonded wafer, sharing a connection at the bonding interface. To measure the overlay (e.g., misalignment or contour), certain systems may utilize a single-focus IR bonding overlay measurement system, such as shown in at least FIG. 1.

FIG. 1 illustrates an IR system of a certain system with a single-focus functionality 100 and an auto-focus functionality 101 capturing images of a bonding interface, in accordance with some embodiments. FIG. 1 can include at least a bonding interface 102 of a bonded wafer, and various depth of fields 104*a-g* (e.g., sometimes referred to as depth of field(s) 104). The depth of field refers to the range of distances over which objects appear in focus in the resulting image (e.g., an image of the object captured with relatively high resolution). The bonding interface 102 of FIG. 1 can be a symbolic representation (or a cross-section) of the interface between wafers. In the single-focus functionality 100, an objective lens 106 may be positioned at a predefined vertical position for capturing images of the bonding interface 102. The objective lens 106 can capture images with relatively high resolution when the content of the image (e.g., a portion of the bonding interface 102) is within the depth of field 104 of the objective lens 106. As shown for the single-focus functionality 100, the objective lens 106 can transition or move horizontally (e.g., x-axis or y-axis) for capturing images of the bonding interface 102. However, if the warpage of the bonding interface 102 is greater than the IR system's field of depth, such as shown in FIG. 1, the objective lens 106 of the IR system may fail to capture relatively clear images of the bonding interface 102 (e.g., images may be blurry or not in focus). For example, by positioning the objective lens 106 at a fixed or predetermined vertical position, its depth of fields 104 when capturing images of the bonding interface 102 can be at a similar vertical range or depth across various x-axis or y-axis planes. In such cases, portions of the bonding interface 102 (e.g., with a certain level of warpage) may not be within the depth of field 104, and therefore, the objective lens 106 may fail to capture images of the portions of the bonding interface 102 for overlay measurements, such as portions corresponding to the depth of fields 104a, 104c-e, and 104g.

Certain systems may utilize the auto-focus functionality 101. As shown in FIG. 1, the bonding interface 102 may be scanned vertically (e.g., along the z-axis of the bonded wafer) using one or more scanning techniques to identify focus points throughout the bonding interface 102. The identified focus points can represent the positioning of the objective lens 106, such that focus points are within the depth of fields 104, for example. The objective lens 106 can be moved or adjusted vertically (e.g., in the z-axis) and horizontally (e.g., x-axis or y-axis) according to the focus points. However, by collecting multiple samples of the focus points throughout the bonding interface 102, merging the samples, and determining the positioning of the objective lens 106 based on the merged samples for capturing images, the utilization of the auto-focus functionality 101 may reduce the throughput or rate of data acquisition (e.g., capturing images) of the bonding interface 102, and increase resource consumption and processing time because vertical scan is performed for the entire sets of distance prior to capturing/taking images. Hence, the systems and methods of the technical solution provide various embodiments for positioning the objective lens 106 of the single-focus IR system for measuring the overlay of the bonded wafer.

According to one implementation, a process for measuring the overlay of a bonded wafer is provided. The process can involve adjusting the positioning of the objective lens 106 to conform with the contour (e.g., contour profile or contour map) or characteristics of the bonding interface 102 without utilizing the auto-focus functionality 101 (e.g., without vertically scanning the entire bonded wafer). For example, an image of the bonded wafer or the bonding interface 102 can be captured by a device or a tool, such as a surface profiler, optical profiler, scanning acoustic microscope (SAM), moiré interferometry, digital holography, or x-ray imaging, among others. The image can be at least one of an x-axis or a y-axis scan of the bonded wafer. In some cases, the tool for capturing the image can be a part of a computing device (or a measurement system), such as but not limited to the computing device/system 500 of FIG. 5. Responsive to performing the scan, the computing device can identify or obtain a contour or visual attributes/characteristics of the bonded wafer. The computing device can map the scan (e.g., including the contour) of the bonding interface 102 of the bonded wafer to generate a profile (e.g., sometimes referred to as a wafer profile or contour profile). Based on the profile, the computing device can adjust the position of the objective lens 106 according to the contour of the bonding interface 102 without using the auto-focus functionality 101. In some implementations, the contour information (e.g., contour profile or map) can be obtained by using at least one suitable metrology tool. Hence, the throughput for capturing images of the bonding interface 102 can be increased and optimized.

FIG. 2 illustrates a flowchart of an example method 200 for overlay measurement. It is noted that the method 200 is merely an example and is not intended to limit the present disclosure. Accordingly, it is understood that additional operations may be provided before, during, and after the method 200 of FIG. 2, and that some other operations may only be briefly described herein.

Figure 3A:
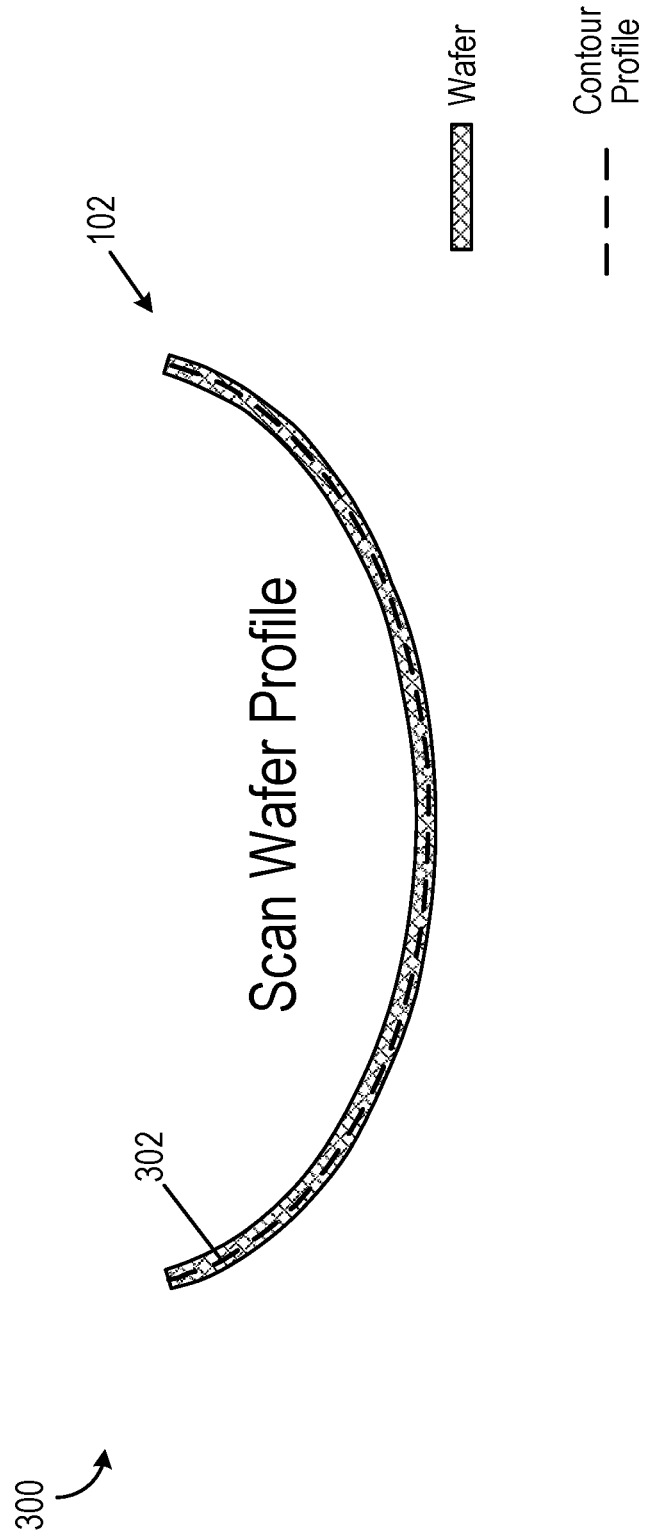
FIGS. 3A-B illustrate various stages to perform the overlay measurement, utilizing the method of FIG. 2, in accordance with some embodiments.
Figure 3B:
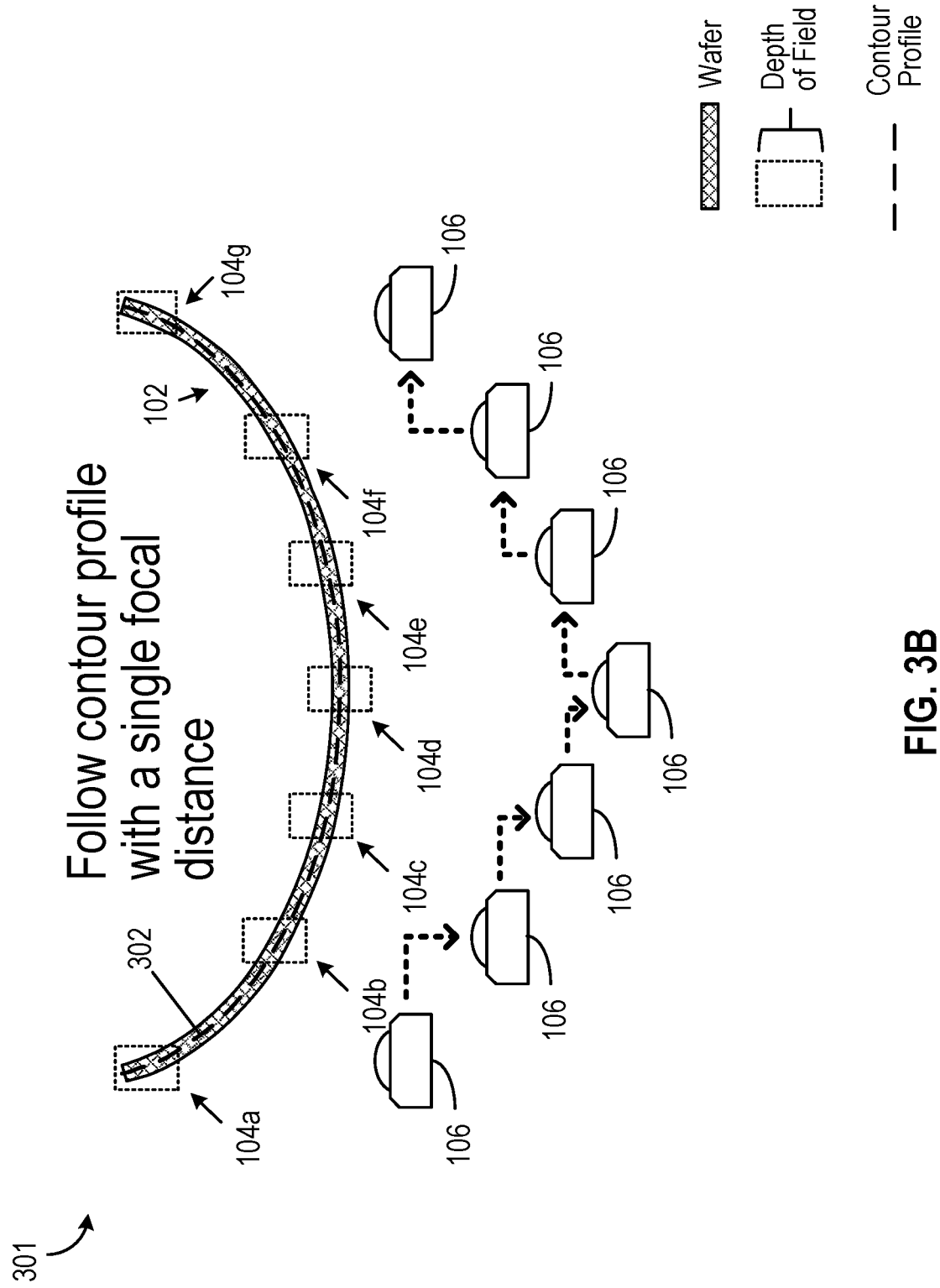

In various embodiments, operations of the method 200 may be associated with various stages 300, 301 to perform the overlay measurement as shown in but not limited to FIGS. 3A-B, which will be discussed in further detail below. It should be understood that the operations of the method 200 can be performed by a computing device, tool, or component configured with the capability to perform the features or functionalities discussed herein, such as the computing device/system 500 of FIG. 5, for example. For simplicity and for purposes of providing examples herein, the operations of the method 200 can be performed by a computing device, which may include, correspond to, or be a part of a measurement system, an inspection system, or a single-focus IR system including the objective lens 106. Although one objective lens 106 is shown in FIGS. 3A-B, multiple objective lens 106 can be implemented for capturing images of the bonding interface 102. In some cases, the single-focus IR system including the objective lens 106 or other components may be external to the computing device. In such cases, the computing device may communicate or provide instruction to the external component, such as to adjust the positioning of the objective lens 106 of the single-focus IR system for capturing images of the bonding interface 102, for example. Other components, devices, or systems may be included herein to perform the operations of the method 200. In overview, the method 200 can include receiving/obtaining/acquiring an image of a bonded wafer, at operation 202. At operation 204, the method 200 can include generating a profile of the bonded wafer. At operation 206, the method 200 can include adjusting/changing/configuring an objective lens 106.

Corresponding to operation 202-206 of FIG. 2, FIGS. 3A-B illustrate stages 300, 301 to perform the overlay measurement. At operation 202, the computing device (e.g., measurement system or inspection system) can receive an image of a bonded wafer. The bonded wafer can include at least a first wafer bonded with a second wafer, where the bonding interface 102 is the connection between the first wafer and the second wafer. The bonding between the first and second wafers can be performed using at least one suitable bonding technique, such as at least one of direct bonding, fusion bonding, adhesive bonding, anodic bonding, etc. The bonding interface 102 can represent a portion of the bonded wafer, not limited to those shown in at least one of FIG. 1 or FIGS. 3A-B, for example. Although the bonding interface 102 is presented as a crescent shape for purposes of simplicity and for providing examples herein, the bonding interface 102 may include other shapes, not limited to flat interface, curved interface, step interface, void interface, or combinations of the various types of interface.

The computing device can obtain the image of the bonded wafer by performing a scan of the bonded wafer. The computing device can pre-scan the bonded wafer, for instance, responsive to the bonding of the first and second wafers or before the bonded wafer is provided to the single-focus IR system for imaging. In some aspects, the computing device may receive the image of the bonded wafer from a storage device (e.g., data repository or data storage) storing at least the image of the bonded wafer or from the scanner scanning the bonded wafer. To scan the bonded wafer, the computing device or the scanner can utilize at least one suitable scanning or imaging technique, such as but not limited to at least one of optical profilometry, scanning electron microscopy (SEM), atomic force microscopy (AFM), SAM, confocal microscopy, x-ray imaging, or laser scanning profilometry. The scan can be performed on the x-axis and the y-axis of the bonded wafer to generate the image.

For example, the computing device (e.g., using the scanner) can perform the scan on at least the bonded wafer to identify or obtain a low spatial frequency component of warpage the bonded wafer (or the bonding interface 102 of the bonded wafer). The low spatial frequency component of warpage refers to the warping or deformation that occurs over certain regions or wavelengths, such as on the surface of the bonded wafer. For instance, the low spatial frequency component of warpage may represent the gradual variations or undulations in the wafer's shape extending over various areas or regions. For instance, the low spatial frequency component of warpage may correspond to or include a contour 302 (or shape) of the bonded wafer or the bonding interface 102. The scan can correspond to or be used for generating the image of the bonded wafer. In some implementations, the image of the bonded wafer may refer to the scan of the bonded wafer. In some cases, the image can include a visual representation (e.g., the structure) of the bonded wafer.

At operation 204, the computing device (e.g., measurement system or inspection system) can generate, based on the image, a profile (e.g., a first profile) of the bonded wafer. The profile may refer to a wafer profile or a contour profile, among others. For example, the computing device can scan the bonded wafer to identify the low spatial frequency component of warpage or the contour 302 of the bonded wafer. Responsive to identifying the low spatial frequency component of warpage, the computing device can map the low spatial frequency component of warpage to the image of the bonded wafer. For instance, by mapping the low spatial frequency component of warpage to the image (e.g., visual representation) of the bonded wafer, the computing device can generate the profile representing or including the association between the low spatial frequency component of warpage and the structure of the bonded wafer. The association between the low spatial frequency component of warpage and the structure of the bonded wafer can correspond to associating the identified contour 302 with the bonding interface 102 of the bonded wafer to generate the profile (e.g., contour profile), such as shown in stage 300 of FIG. 3A.

For example, the stage 300 of FIG. 3A shows the bonding interface 102 of the bonded wafer with a particular contour 302 or shape identified according to the scanning of the bonded wafer. Responsive to scanning the bonded wafer and mapping the scan to the image of the bonded wafer, the computing device can obtain or identify the contour 302 of the bonded wafer with respect to the bonding interface 102 as part of the profile. As such, the profile of the bonded wafer can include, indicate, or represent the contour 302 of the bonding interface 102, which can be used to position the objective lens 106. The contour 302 of the bonded wafer can be determined or identified without vertically scanning the bonded wafer (or the bonding interface 102), such as along the z-axis of the bonded wafer.

In various cases, the computing device can store the profile of the bonded wafer in a look-up table in response to generating the profile. The computing device can store the profile in a storage device or a memory local or external to the computing device, for example. The computing device can retrieve the profile from the storage device. In some cases, other authorized devices may access the profile from the storage device. For instance, the profile may be retrieved by an IR system (e.g., single-focus IR system) to perform adjustments to the objective lens 106 according to the profile. The computing device can retrieve the profile from the look-up table using a key generated, for instance, according to the identification, warpage characteristics (e.g., measurement, shape, etc.) of the bonded wafer, timestamps, tools or machines utilized for bonding or analyzing the first and second wafers, or other fingerprints associated with the bonded wafer. In some cases, the computing device (e.g., IR system) can utilize the profile, such as the same profile generated from the bonded wafer, for another bonded wafer or another bonding interface associated with a different bonded wafer in the same semiconductor package (e.g., the same stack of wafers, wafers fabricated or bonded using the same machines, devices, or tools, etc.).

At operation 206, the computing device (e.g., IR system) can adjust, using the profile, the position (e.g., vertical position, such as up and down relative to the surface of the wafer) of the objective lens 106 to perform an overlay measurement of the bonded wafer. The computing device can command or instruct the IR system to adjust the position of the objective lens 106 for capturing images of the bonding interface 102 along the contour 302. The adjustment of the objective lens 106 for capturing images can be shown in at least stage 301 of FIG. 3B, for example.

For example, as shown in FIG. 3B, the profile can include the contour 302 along the bonding interface 102 of the bonded wafer. Using the profile, the computing device can command the IR system (or other component configured to position the objective lens 106) to adjust the objective lens 106 along the contour 302 of the bonding interface 102 of the bonded wafer to perform the overlay measurement of the bonded wafer. Adjusting the objective lens 106 can include adjusting the positioning of the objective lens 106 (e.g., sometimes referred to as the head) to have a predefined focal distance from the bonding interface 102 of the bonded wafer according to or following the profile (e.g., contour map via pre-scanned wafer data). With the predefined focal distance between the objective lens 106 (e.g., head of the lens) and the bonding interface 102, portions of the bonding interface can be within the depth of fields 104.

Figure 4:
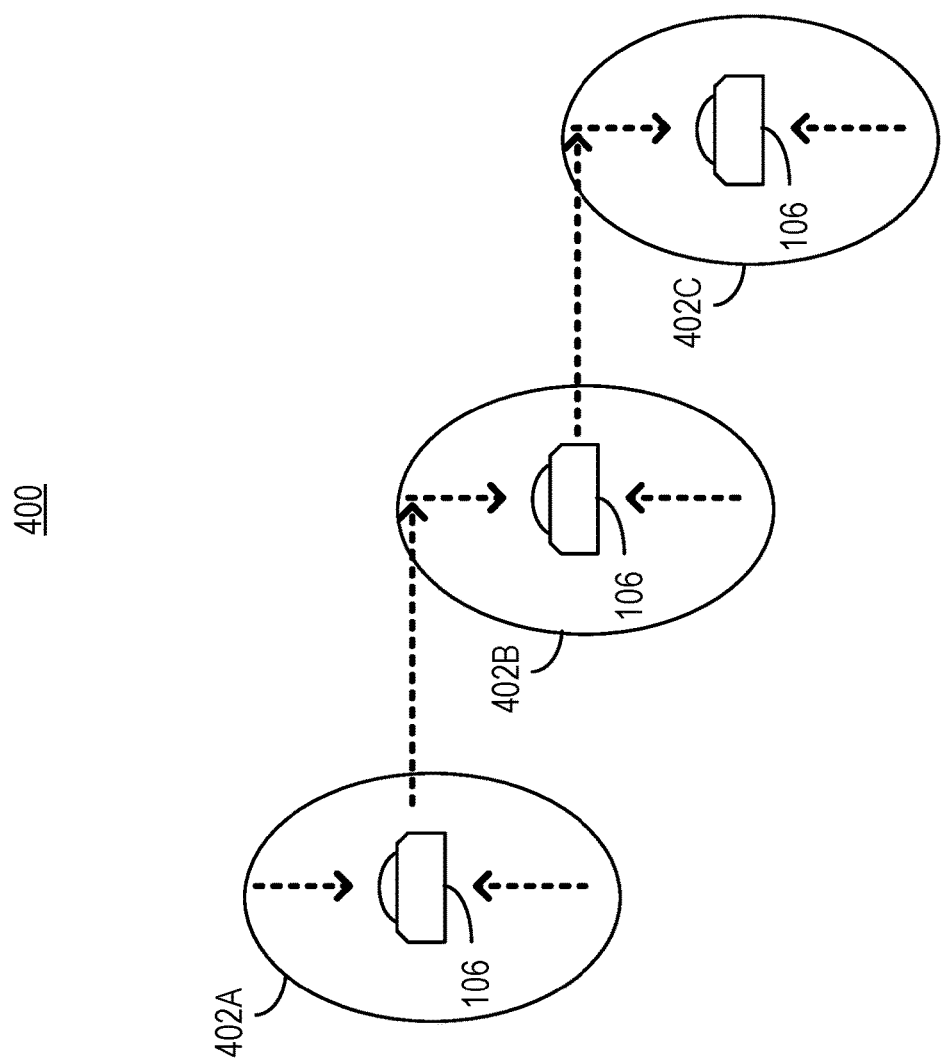
FIG. 4 illustrates movements of an objective lens for focusing on a bonding interface, in accordance with some embodiments.

An example of adjusting the objective lens 106 can be described in conjunction with but not limited to FIG. 4, for example. For example, FIG. 4 depicts an illustration 400 of example movements of the objective lens 106 for focusing on the bonding interface 102, such as along the contour 302. As shown, the objective lens 106 can be adjusted along the z-direction to be positioned within area 402a, such that a portion of the bonding interface 102 can be within the depth of fields 104 of the objective lens 106. The objective lens 106 can be adjusted along the x-direction and/or y-direction for capturing an image of a second portion of the bonding interface 102. Similarly, the objective lens 106 can be adjusted along the z-direction to be positioned within area 402b, such that the second portion can be within the depth of fields 104 of the objective lens 106. The objective lens 106 can be adjusted along the x-direction, y-direction, and/or z-direction for positioning within area 402c, such that a third portion of the bonding interface 102 can be within the depth of fields 104 of the objective lens 106, etc.

Responsive to adjusting the objective lens 106, the computing device (e.g., single-focus IR system) can command or use the objective lens 106 to obtain or capture at least one image of the bonded wafer at each respective position following the contour 302. By following the profile (e.g., the contour 302), the computing device (e.g., single-focus IR system) can obtain relatively clear, in-focus images of the bonding interface 102 from the objective lens 106. With the images captured by the objective lens 106, the computing device can perform the overlay measurement to measure wafer bonding overlay errors. For example, the overlay measurement can include one or more overlay marks between the first wafer and the second wafer. The computing device can analyze these marks to determine any misalignment between the bonding of the wafers, such as misalignment between the first wafer and the second wafer. According to, but not limited to, the operations of the method 200, the computing device (or various components discussed herein) can integrate various tools to adjust the objective lens 106 (with a single focal distance) according to the contour 302 for capturing in-focus images of the bonding interface 102, without utilizing the auto-focus features (e.g., auto-focus functionality 101), thereby optimizing the data acquisition of images, minimize resource consumption, and avoid vertical scans of the bonded wafer.

In some configurations, the computing device can receive a second image of a second bonded wafer. The second bonded wafer may include a second bonding interface formed between a third wafer and a fourth wafer, for example. In some cases, the second bonded wafer may include the second bonding interface between the third wafer and the first wafer or between the fourth wafer and the second wafer. The second image can include a scan of the second bonded wafer or a structure of the second bonded wafer. In some cases, the second bonded wafer can be part of the same semiconductor package (e.g., same product) as the (e.g., first) bonded wafer between the first wafer and the second wafer). In some cases, the computing device can determine that a variation between the contour 302 of the bonded wafer and a second contour of the second bonded wafer is within a predefined range, for instance, the bonded wafer includes a similar warpage pattern (e.g., according to the scan) as the second bonded wafer, such as within a predefined microns. In such cases where the second bonded wafer is from the same semiconductor package or includes a similar warpage pattern as the bonded wafer (e.g., similar to the bonding interface 102), the computing device can use the same profile (e.g., the first profile) of the bonding interface 102 for adjusting the objective lens 106 to capture images for the second bonding interface of the second bonded wafer. Because the warpage pattern is similar between the bonded wafer and the second bonded wafer, the bonding interfaces of these bonded wafers can be within the depth of fields 104 associated with the profile. Responsive to the adjustment, the computing device can perform the measurement of the overlay of the second bonded wafer.

In some aspects, the second bonded wafer may not be from the same semiconductor package and does not include a similar warpage pattern. In such cases, the computing device can iterate various operations of the method 200, such as generating a second profile associated with the second bonded wafer. The computing device can store the second profile including a second contour of the second bonding interface of the second bonded wafer to the storage device. In such cases, the computing device can adjust the objective lens 106 according to the second profile (e.g., second contour) for capturing images of the second bonding interface.

Figure 5:
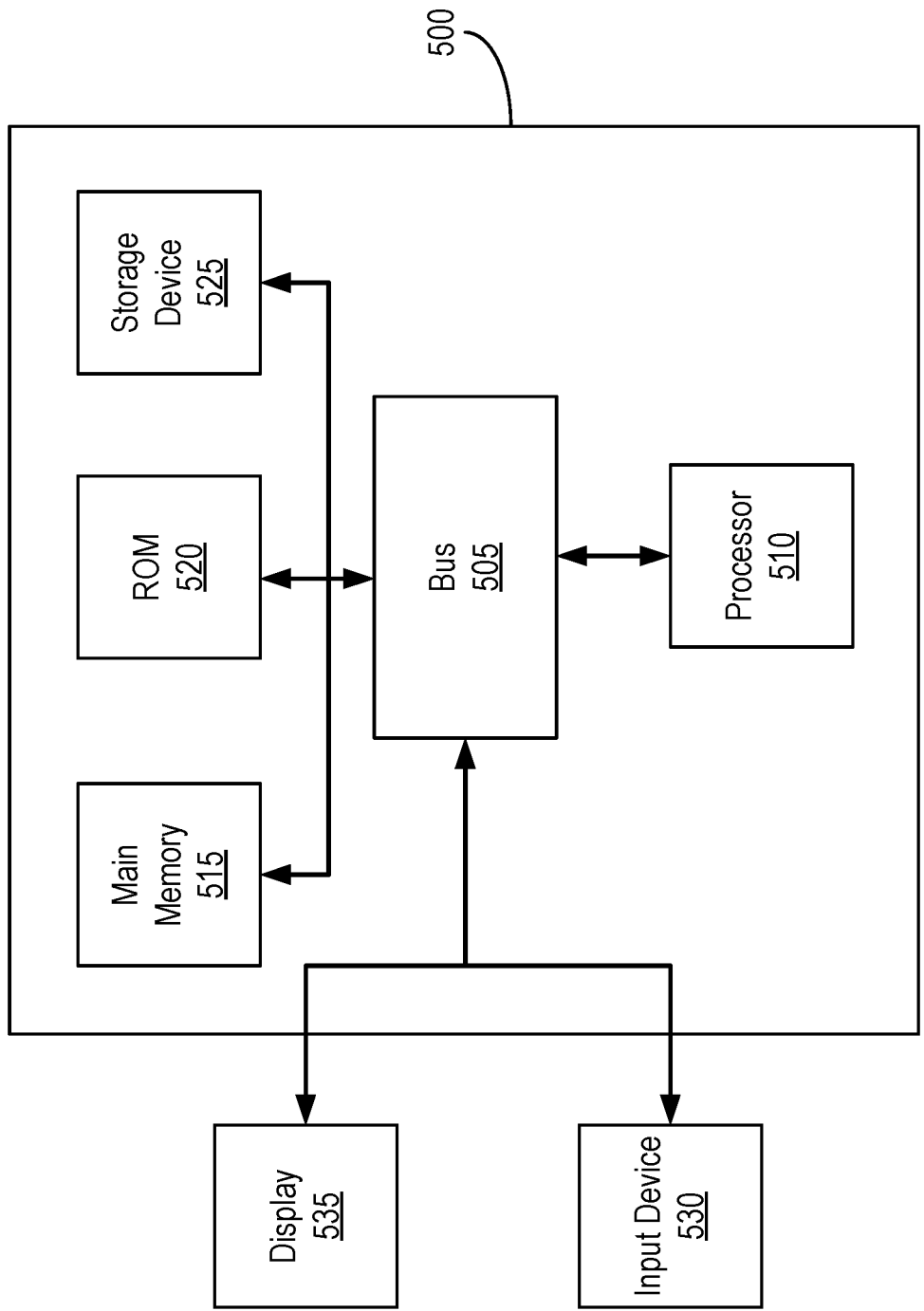
FIG. 5 is a block diagram illustrating an architecture for a computer system that can be employed to implement elements of the systems and methods described and illustrated herein, including, for example, aspects of the overlay measurement system depicted in FIGS. 1-3B.

FIG. 5 is a block diagram of an example computer system 500. The computer system or computing device 500 can include or be used to implement any computing device, processing system, or its components. The computing system 500 includes at least one bus 505 or other communication component for communicating information and at least one processor 510 or processing circuit coupled to the bus 505 for processing information. The computing system 500 can also include one or more processors 510 or processing circuits coupled to the bus for processing information. The computing system 500 also includes at least one main memory 515, such as a random access memory (RAM) or other dynamic storage device, coupled to the bus 505 for storing information, and instructions to be executed by the processor 510. The main memory 515 can also be used for storing position information, utility grid data, command instructions, device status information, environmental information within or external to the utility grid, information on characteristics of electricity, or other information during execution of instructions by the processor 510. The computing system 500 may further include at least one read only memory (ROM) 520 or other static storage device coupled to the bus 505 for storing static information and instructions for the processor 510. A storage device 525, such as a solid state device, magnetic disk or optical disk, can be coupled to the bus 505 to persistently store information and instructions.

The computing system 500 may be coupled via the bus 505 to a display 535, such as a liquid crystal display, or active matrix display, for displaying information to a user such as an administrator of the data processing system or the utility grid. An input device 530, such as a keyboard or voice interface may be coupled to the bus 505 for communicating information and commands to the processor 510. The input device 530 can include a touch screen display 535. The input device 530 can also include a cursor control, such as a mouse, a trackball, or cursor direction keys, for communicating direction information and command selections to the processor 510 and for controlling cursor movement on the display 535. The display 535 can be part of the computing device, or other components configured to perform the operations of the method 200, among others.

The processes, systems, and methods described herein can be implemented by the computing system 500 in response to the processor 510 executing an arrangement of instructions contained in main memory 515. Such instructions can be read into main memory 515 from another computer-readable medium, such as the storage device 525. Execution of the arrangement of instructions contained in main memory 515 causes the computing system 500 to perform the illustrative processes described herein. One or more processors in a multi-processing arrangement may also be employed to execute the instructions contained in main memory 515. Hard-wired circuitry can be used in place of or in combination with software instructions together with the systems and methods described herein. Systems and methods described herein are not limited to any specific combination of hardware circuitry and software.

Although an example computing system has been described in FIG. 5, the subject matter including the operations described in this specification can be implemented in other types of digital electronic circuitry, or in computer software, firmware, or hardware, including the structures disclosed in this specification and their structural equivalents, or in combinations of one or more of them.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for measuring overlay, comprising:
receiving an image of a bonded wafer;
generating, based on the image, a profile of the bonded wafer; and
adjusting, using the profile, an objective lens of a single-focus image-based infrared (IR) system to perform an overlay measurement of the bonded wafer.

2. The method of claim 1, wherein the profile comprises a contour of the bonded wafer, and wherein adjusting the objective lens comprises:
adjusting the objective lens along the contour of the bonded wafer to perform the overlay measurement of the bonded wafer.

3. The method of claim 2, wherein the contour of the bonded wafer is determined without a vertical scan of the bonded wafer.

4. The method of claim 1, wherein generating the profile comprises:
scanning a low spatial frequency component of warpage of at least the bonded wafer; and
mapping the low spatial frequency component of the warpage to the image of the bonded wafer to generate the profile.

5. The method of claim 1, wherein adjusting the objective lens comprises:
adjusting the objective lens to a position having a predefined focal distance from the bonded wafer according to the profile; and
responsive to adjusting the objective lens, obtaining at least one image of the bonded wafer at the position using the objective lens.

6. The method of claim 1, wherein the bonded wafer comprises a first wafer coupled to a second wafer, and wherein the overlay measurement comprises an overlay mark between the first wafer and the second wafer.

7. The method of claim 1, further comprising:
receiving a second image of a second bonded wafer; and
adjusting, using the profile, the objective lens to perform the overlay measurement of the second bonded wafer.

8. The method of claim 7, wherein a variation between a first contour of the bonded wafer and a second contour of the second bonded wafer is within a predefined range.

9. The method of claim 1, further comprising:
storing the profile of the bonded wafer in a look-up table in response to generating the profile.

10. The method of claim 1, wherein receiving the image of the bonded wafer comprises scanning at least one of an x-axis or a y-axis of the bonded wafer to generate the image.

11. A measurement system, comprising:
at least one processor configured to:
receive an image of a bonded wafer;
generate, based on the image, a profile of the bonded wafer; and
adjust, using the profile, an objective lens of a single-focus image-based infrared (IR) system to perform an overlay measurement of the bonded wafer.

12. The measurement system of claim 11, wherein the profile comprises a contour of the bonded wafer, and wherein to adjust the objective lens, the measurement system is configured to:
adjust the objective lens along the contour of the bonded wafer to perform the overlay measurement of the bonded wafer.

13. The measurement system of claim 12, wherein the contour of the bonded wafer is determined without a vertical scan of the bonded wafer.

14. The measurement system of claim 11, wherein to generate the profile, the at least one processor is configured to:
scan a low spatial frequency component of warpage of at least the bonded wafer; and
map the low spatial frequency component of the warpage to the image of the bonded wafer to generate the profile.

15. The measurement system of claim 11, wherein to adjust the objective lens, the at least one processor is configured to:
adjust the objective lens to a position having a predefined focal distance from the bonded wafer according to the profile; and
responsive to adjusting the objective lens, obtain at least one image of the bonded wafer at the position using the objective lens.

16. An apparatus, comprising:
   an inspection system comprising at least one processor configured to:
      receive an image of a bonded wafer;
      generate, based on the image, a profile of the bonded wafer; and
   a single-focus image-based infrared (IR) system comprising an objective lens, configured to:
      adjust, using the profile, the objective lens to perform an overlay measurement of the bonded wafer.

17. The apparatus of claim 16, wherein the bonded wafer comprises a first wafer coupled to a second wafer, and wherein the overlay measurement comprises an overlay mark between the first wafer and the second wafer.

18. The apparatus of claim 16, wherein:
   the at least one processor is further configured to:
      receive a second image of a second bonded wafer; and
   the single-focus IR system is further configured to:
      adjust, using the profile, the objective lens to perform the overlay measurement of the second bonded wafer.

19. The apparatus of claim 18, wherein a variation between a first contour of the bonded wafer and a second contour of the second bonded wafer is within a predefined range.

20. The apparatus of claim 16, further comprising:
   a storage device configured to store the profile of the bonded wafer in a look-up table in response to generating the profile.

* * * * *